(12) United States Patent  (10) Patent No.: US 8,426,114 B2
Haffner et al.  (45) Date of Patent: Apr. 23, 2013

(54) L-SHAPED FEATURE, METHOD OF MAKING AN L-SHAPED FEATURE AND METHOD OF MAKING AN L-SHAPED STRUCTURE

(75) Inventors: Henning Haffner, Pawling, NY (US); Martin Ostermayr, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 167 days.

(21) Appl. No.: 13/016,841

(22) Filed: Jan. 28, 2011

(65) Prior Publication Data

US 2012/0196209 A1  Aug. 2, 2012

(51) Int. Cl.
*G03F 7/00* (2006.01)
(52) U.S. Cl.
USPC .......................................... 430/311; 430/394

(58) Field of Classification Search .............. 430/5, 311, 430/312, 313, 394; 716/50–56
See application file for complete search history.

(56) References Cited

U.S. PATENT DOCUMENTS 6,680,151 B2 * 1/2004 Heissmeier et al. .............. 430/5
2002/0129327 A1 * 9/2002 Pierrat et al. .................... 716/19

* cited by examiner

*Primary Examiner* — Stephen Rosasco
(74) *Attorney, Agent, or Firm* — Slater & Matsil, L.L.P.

(57) ABSTRACT

In accordance with an embodiment of the present invention, a method for making a semiconductor device comprises forming a photo sensitive layer on a semiconductive substrate, and forming an L-shaped structure in the photo sensitive layer by exposing the photo sensitive layer to light via a reticle, wherein the reticle comprises an L-shapes feature having a first non-orthogonal edge at an intersection of two legs of the L-shaped feature.

22 Claims, 8 Drawing Sheets

460 : DESIGN LAYOUT
470 : TARGET LAYOUT
480 : MASK LAYOUT

L-SHAPED FEATURE, METHOD OF MAKING AN L-SHAPED FEATURE AND METHOD OF MAKING AN L-SHAPED STRUCTURE

The present invention relates generally to the fabrication of semiconductor devices, and more particularly to patterning features of semiconductor devices and structures thereof.

BACKGROUND

Semiconductor devices are used in a variety of electronic applications, such as personal computers, cell phones, digital cameras, and other electronic equipment, as examples. Semiconductor devices are typically fabricated by sequentially depositing several insulating or dielectric layers, conductive layers, and semiconductive layers of material over a semiconductor substrate, and patterning the various layers using lithography to form circuit components and elements thereon.

There is a trend in the semiconductor industry towards reducing the size of features, e.g., the circuits, elements, conductive lines, vias, and contacts of semiconductor devices, in order to improve the performance of the semiconductor devices, reduce power consumption, and meet smaller packaging requirements, for example. However, as feature sizes of semiconductor devices diminish, the patterning of features becomes more challenging. The transfer of patterns of lithography masks to semiconductor devices having small feature sizes may be inaccurate or unpredictable in some applications, for example.

SUMMARY OF THE INVENTION

In accordance with an embodiment of the present invention, a method for making a semiconductor device is disclosed. The method comprises forming a photo sensitive layer on a semiconductive substrate, and forming an L-shaped structure in the photo sensitive layer by exposing the photo sensitive layer to light via a reticle, wherein the reticle comprises an L-shape feature having a first non-orthogonal edge at an intersection of two legs of the L-shaped feature.

In accordance with an embodiment of the present invention, a mask is disclosed. The mask comprises a transparent substrate and a pattern forming material arranged over the transparent substrate, wherein the pattern forming material comprises an L-shaped feature.

In accordance with an embodiment of the present invention, a method for making a mask is disclosed. The method comprises forming a pattern forming material over a transparent substrate and patterning the pattern forming material so that the pattern forming material comprises an L-shaped feature.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely forming an L-shaped structure in a material layer. The invention may also be applied to forming an L-shaped structure in a substrate or a wafer.

In one embodiment an L-shaped structure is formed in a material layer. The L-shaped structure may be formed by using a lithography mask having an L-shaped feature. The L-shaped feature on the lithography mask may comprise a non-orthogonal edge. The L-shaped feature may comprise an edge having an angle of about 45 degree. The L-shaped structure in the material layer may be formed by single exposure process of a lithography mask.

An advantage of an embodiment is that an L-shaped structure may be formed in a material layer or a substrate with a single exposure process of a lithography mask. Another advantage of an embodiment is that the L-shaped structure formed in the material layer or substrate may allow the manufacturing of semiconductor devices using less silicon area on a wafer.

Figure 1:
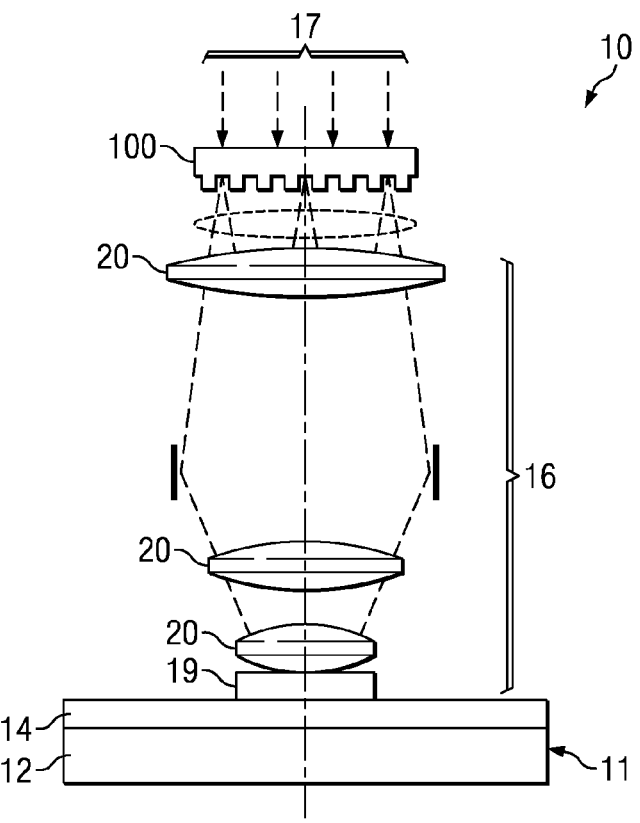
FIG. 1 illustrates a lithography system.

FIG. 1 shows a schematic of an optical immersion lithography system 10. The lithography system 10 is also referred to in the art as a scanner, stepper, or exposure tool, as examples. A semiconductor device 11, also referred to herein as a wafer, to be patterned includes a substrate or a material layer 12. A layer of photosensitive material 14 is disposed over the substrate or the material layer 12. The semiconductor device 11 is placed on a wafer support or stage (not shown) proximate an optics column 16. The optics column 16 may comprise a lens system 20.

A lithography mask or reticle 100 is disposed between the optics column 16 and an illuminator or light source. Light, energy, or radiation 17 from the illuminator is passed through the lithography mask 100 and the optics column 16 to impinge upon the layer of photosensitive material 14 on the semiconductor device 11. The layer of photosensitive material 14 is patterned with the pattern of the lithography mask 100. After exposure, the pattern in the layer of photosensitive material 14 comprises a latent pattern, which is then developed to form a pattern in the layer of photosensitive material. The optics column 16 may comprise a plurality of lenses 20. In an immersion lithography system 10, for example, an immersion fluid 19 is disposed between the last lens and the semiconductor device 11. The lithography system 10 may be a system other than an immersion lithography system.

The mask pattern is projected and in some applications shrunk by four or five times onto the wafer surface, for example. The lithography target layout and design layout may comprise the same forms of the features in some embodiments. In some embodiments the lithography target layout and the design layout may be different for some feature forms, e.g., when a lithography sub-resolution gap is used. The lithography sub-resolution gap may appear in the lithography target layout but not in the design layout.

The lithography mask or reticle 100 may be a binary mask. The reticle 100 may comprise a transparent substrate and a structured layer of a pattern forming material. The pattern forming material may be transparent where a pattern is formed and opaque where no pattern is formed. Alternatively, the pattern forming material may be opaque where a pattern is formed and transparent where no pattern is formed.

The lithography mask or reticle 100 may be an attenuated phase-shifting mask. In an attenuated phase-shifting mask 100 the pattern forming material layer may be partially transmissive in some or all regions of the lithography mask. The partially transmissive material may be a material such as MoSi, although other attenuating materials may be used. In some embodiments the attenuating phase-shifting material may comprise different thicknesses in different regions.

The lithography mask or reticle 100 may be an alternating phase shifting mask. In an alternating phase-shifting mask the thickness of the mask may vary in some regions of the substrate and/or the pattern forming material.

Figure 2A:
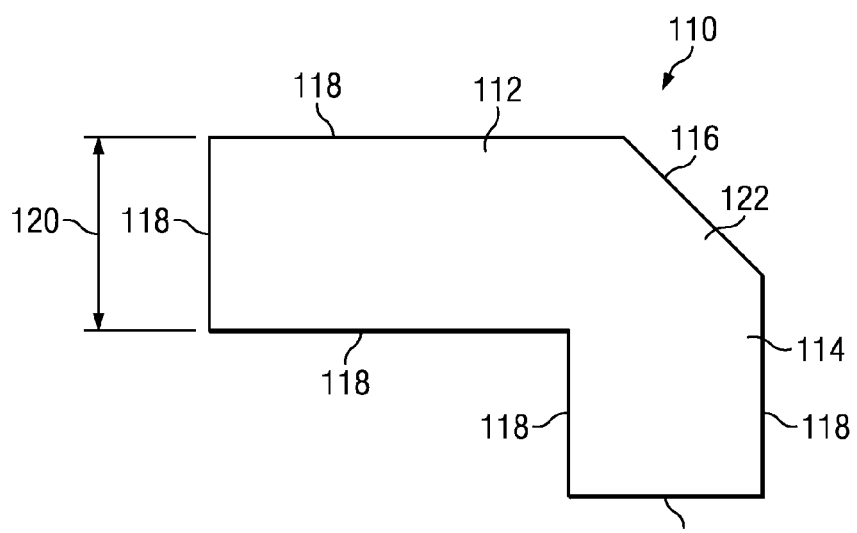
FIG. 2a illustrates a lithography target layout of a feature for a lithography mask.
Figure 2B:
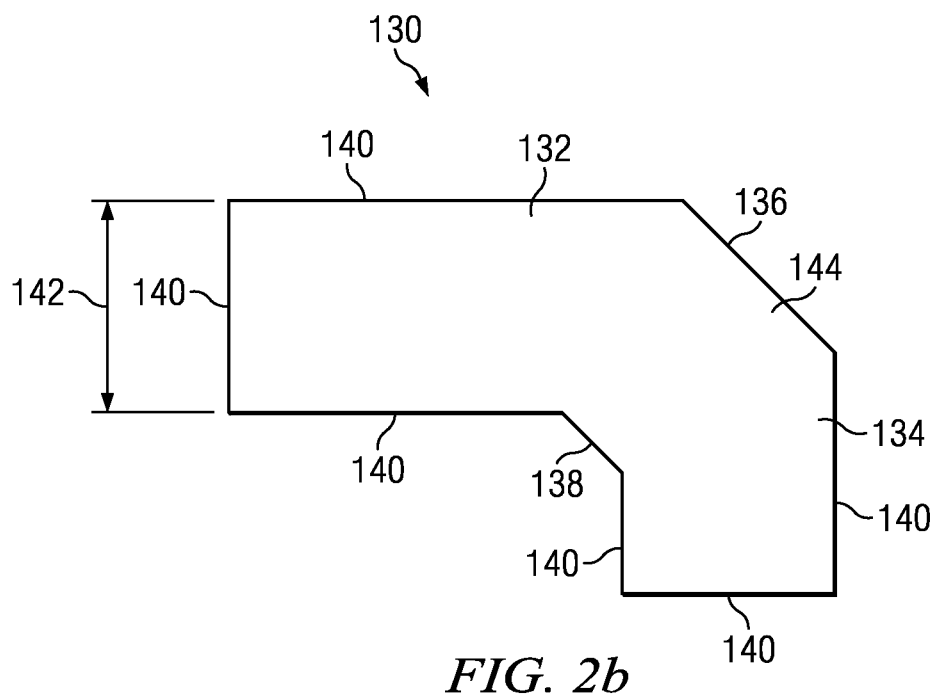
FIG. 2b illustrates a lithography target layout of a feature for a lithography mask.
Figure 2C:
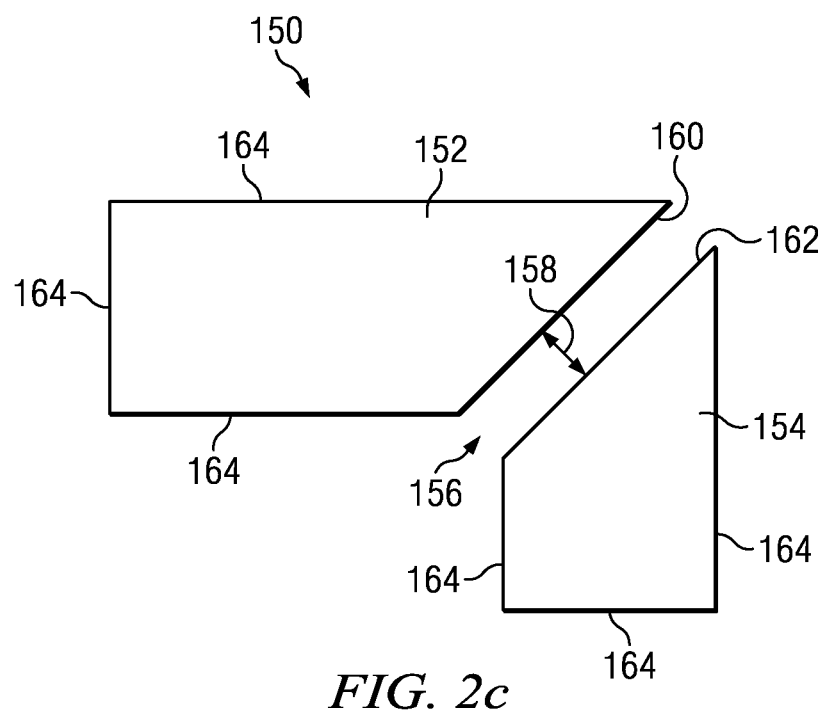
FIG. 2c illustrates a lithography target layout of a feature for a lithography mask.

Referring now to FIGS. 2a-2c, embodiments of a target layout for a reticle 100 will be described. The target layout, modified with an optical proximity correction (OPC) for example, may form a mask layout. The mask layout may be printed on the lithography mask 100 in a pattern forming material layer. The (OPC modified) L-shaped features 110, 130, 150 may be part of the pattern in the pattern forming material layer of the photolithography mask. The L-shaped features 110, 130, 150 may form a part of an opaque, partially transmissive or transparent pattern on the photolithography mask.

FIG. 2a shows an embodiment of an L-shape feature 110 of a target layout. The L-shaped feature may comprise a first leg 112 and a second leg 114 which are arranged orthogonal to one another. The L-shaped feature 110 may comprise an edge 116 which is non-orthogonal to the other edges 118 of the feature 110. The non-orthogonal edge 116 may be arranged at an angle of about 40 degrees to about 50 degrees relative to the other edges 118. Alternatively, the non-orthogonal edge 116 may be arranged at an angle of about 45 degrees. The non-orthogonal edge 116 may decrease a width 120 of the feature 110 at an intersection 122. The intersection 122 may be a point where the first leg 112 and the second leg 114 of the L-shape feature 110 meet. The first leg 112 and the second leg 114 may comprise the same lengths and/or the same dimensions, or may comprise different lengths and/or different dimensions. The L-shaped feature 110 may be a feature of the lithography target layout and may be modified with an optical proximity correction (OPC) to become a mask layout. A corresponding design layout may comprise an identical L-shaped feature form.

FIG. 2b illustrates an embodiment of an L-shaped feature 130 of a target layout having two non-orthogonal edges 136, 138. The two non-orthogonal edges 136, 138 may be arranged at an angle of about 40 degrees to about 50 degrees relative to the other edges 140. Alternatively, the two non-orthogonal edges 136, 138 may be arranged at an angle of about 45 degrees to relative to the other edges 140. The two non-orthogonal edges 136, 138 may be arranged parallel or non-parallel to each other. The two non-orthogonal edges 136, 138 may decrease or increase the width 142 of the feature 130 at the intersection 144. In one embodiment the first leg 132 and the second leg 134 comprise the same lengths and/or the same dimensions, or may comprise different length and/or different dimensions. Again, the L-shaped feature 130 may be a feature of the target layout and may be modified with an optical proximity correction (OPC) to become a mask layout. A corresponding design layout may comprise an identical L-shaped feature form.

FIG. 2c illustrates an embodiment of an L-shaped feature 150 of a target layout subdivided into two sub-features 152, 154. The two sub-features 152, 154 may be separated by a lithographic sub-resolution gap 156. In a reticle, the gap 156 may be opaque if the two sub-features 152, 154 are transparent or the gap 156 may be transparent if the two sub-features 152, 154 are opaque. The distance 158 of the gap 156 may be a sub-resolution distance. The sub-resolution distance 158 may be about 30 nm or less, for example. Each of the two sub-features 152, 154 may comprise a non-orthogonal edge 160, 162. The two non-orthogonal edges 160, 162 may be arranged at an angle of about 40 degrees to about 50 degrees relative to the other edges 164. Alternatively, the non-orthogonal edges 160, 162 may be arranged at an angle of about 45 degrees relative to the other edges 164. The two non-orthogonal edges 160, 162 of the two sub-features 152, 154 may face each other and may be parallel or non-parallel relative to each other. In one embodiment the two sub-features 152, 154 comprise the same lengths and/or the same dimensions, or may comprise different lengths and/or different dimensions. In one embodiment, the L-shaped feature 150 may comprise more than two sub-features 152, 154. Again, the L-shaped feature 150 may be a feature of the target layout and may be modified with an optical proximity correction (OPC) to become a mask layout. A possible OPC modified L-shaped feature 150 can be seen in FIG. 4c. A corresponding design layout may comprise an L-shaped feature form different to L-shaped feature 150. For example, the corresponding design layout may comprise an L-shaped feature form more similar or identical to the L-shaped feature form 110.

Figure 3A:
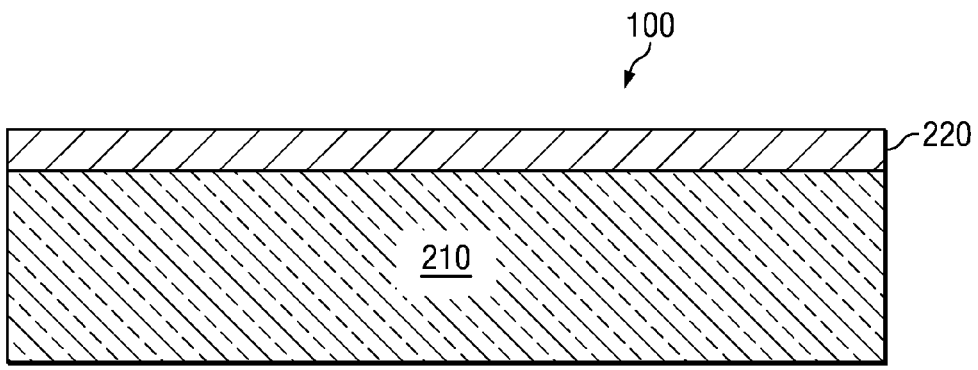
FIGS. 3a through 3c show cross sectional views of a method of manufacturing a lithography mask.
Figure 3B:
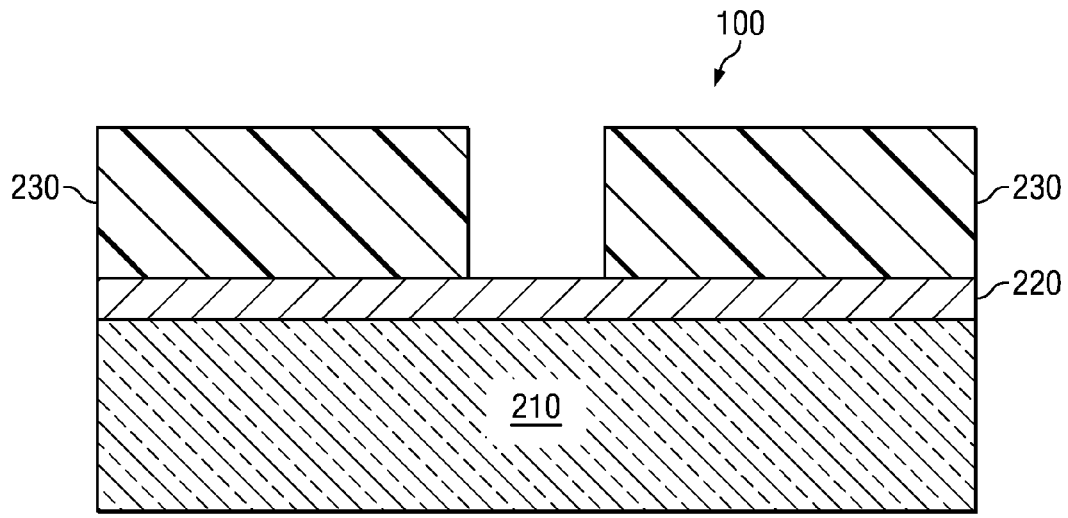
Figure 3C:
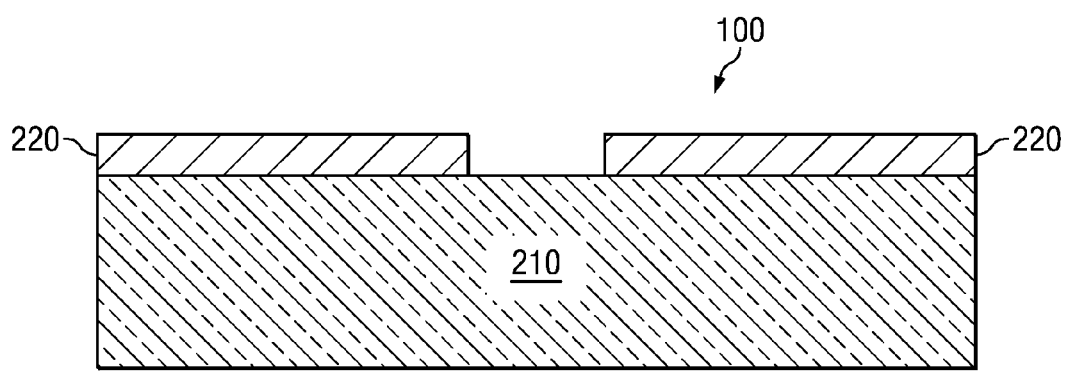

FIGS. 3a-3c show cross sectional view of an embodiment of a lithography mask 100. The substrate 210 may comprise a transparent material such as quartz, fused silica, glass or the like. The substrate 210 may comprise a thickness of about ¼ inch, for example, although alternatively, the substrate 210 may comprise other dimensions.

A pattern-forming material 220 is disposed over the substrate 210. The pattern forming material 220 may comprise an absorber or an attenuating material. The pattern forming material 220 may comprise chromium (Cr) in some embodiments, although alternatively, the pattern forming material 220 may comprise other materials. The pattern forming material 220 may be about 50 nm to about 100 nm thick, although alternatively the pattern forming material 220 may comprise other dimensions.

A photoresist 230 is formed over pattern-forming material 220. The photoresist 230 is patterned and the pattern is transferred in the pattern forming material 220. The pattern formed in the pattern forming material 220 may comprise the features of the mask layout corresponding to the lithography target layout and the L-shaped features 110, 130, 150 of the embodiments shown in FIGS. 2a-2c. In some embodiments the features mask layout may also be transferred into the substrate 210. The photoresist 230 may be stripped from the pattern forming material and the formation of the photolithography mask 100 may be finalized. The lithography mask 100 may comprise only one type of the L-shaped features 110, 130, 150 or a combination of the types of the L-shaped features 110, 130, 150.

The lithography mask 100 may be used in the lithographic system 10 to pattern a photoresist 14 formed on a material layer 12. The lithographic system 10 uses light 17 to transfer a geometric pattern of a reticle 100 to a light-sensitive photoresist 14 on a material layer or a substrate 12.

Figure 4A:
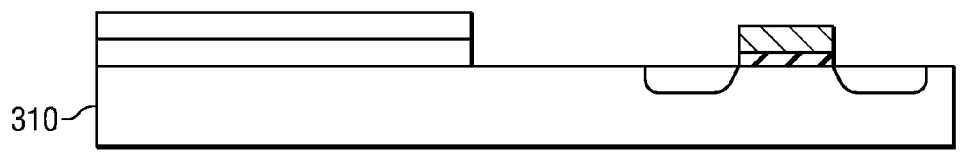
FIGS. 4a through 4f show cross sectional views of a method of manufacturing a semiconductor device.

FIG. 4a through FIG. 4f illustrate a method of manufacturing a semiconductor device using the lithography mask 100. FIG. 4a shows a portion of the semiconductor wafer or a substrate 310. The substrate 310 may have been processed and semiconductor devices such as transistors, for example, may have been formed. The substrate 310 may be silicon (Si), silicon-germanium (SiGe), gallium arsenide (GaAs), indium phosphide (InP), silicon carbide (SiC) or the like. The substrate may be bulk silicon or silicon on insulator (SOI), for example.

Figure 4B:
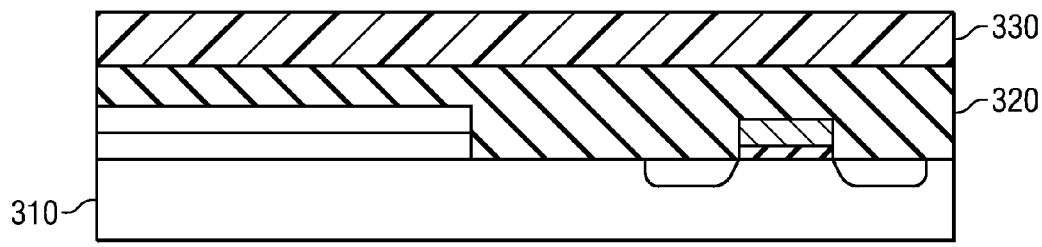

A material layer 320 may be formed on the substrate 310. The material layer 320 may be an isolation layer such as silicon oxide, a low-k dielectric material or the like. A photoresist layer 330 may be formed on the material layer 320. The photoresist layer 330 may be a positive or a negative photoresist. This is shown in FIG. 4b.

Figure 4C:
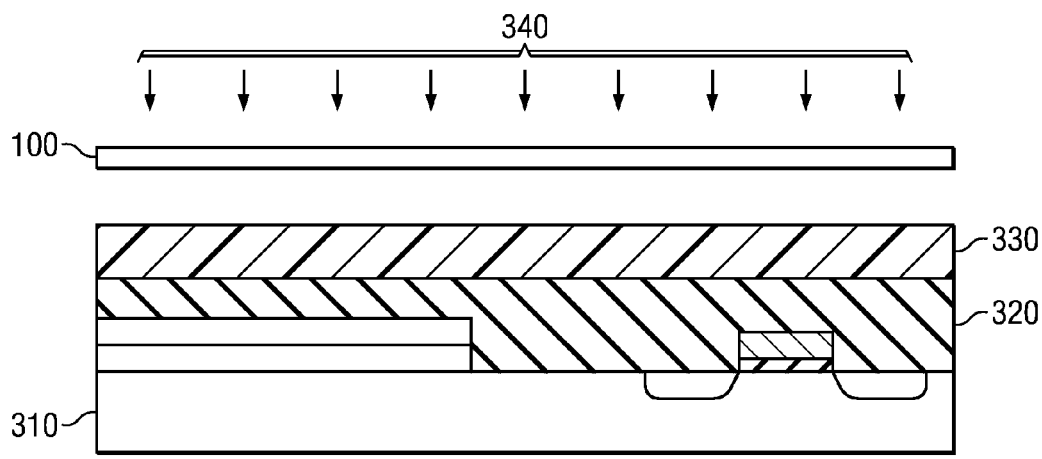

Referring now to FIG. 4c, the photoresist layer 330 may be patterned by exposing light 340 through the lithography mask 200 comprising the mask layout corresponding to the features 110, 130, 150. The photoresist layer 330 may be patterned applying a single exposure process. In other words, the photoresist layer 330 is exposed using one or a single lithography mask 200. The photoresist layer 330 may be patterned without applying a double exposure process. That is, the photoresist layer 330 may not be exposed in a sequence of two separate exposures using two different lithography masks. Moreover, the photoresist layer 330 may be patterned without applying a double patterning process. That is, the L-shaped feature may not be formed with two exposures of two different resists.

Figure 4D:
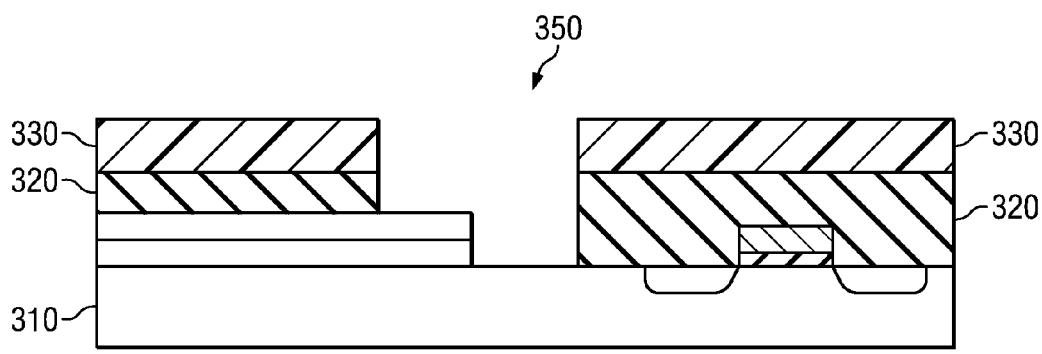

Referring now to FIG. 4d, an L-shape structure 350 may be printed into the photoresist layer 330 by exposing the lithography mask 200 comprising the mask layout with the corresponding L-shaped features 110, 130, 150. The photoresist layer 330 may be developed applying known techniques. In one example, the photoresist layer 330 may comprise an innovative photoresist which may be developed apply negative tone develop. The L-shaped structure 350 in the photoresist layer 330 may comprise a form of a curve, an oblong curved pattern, or an crescent where one end is elongated or straightened. The L-shaped structure 350 may be transferred into the underlying material layer 320.

FIG. 4d shows a positive photoresist layer 330 being exposed with a darkfield mask 100 (structures are transparent on opaque background). Alternatively, a negative photoresist layer 330 may be exposed with a darkfield mask 100. Other alternatives may include exposing a positive or negative photoresist layer 330 with a mask 100 comprising opaque structures on a transparent background.

Figure 4E:
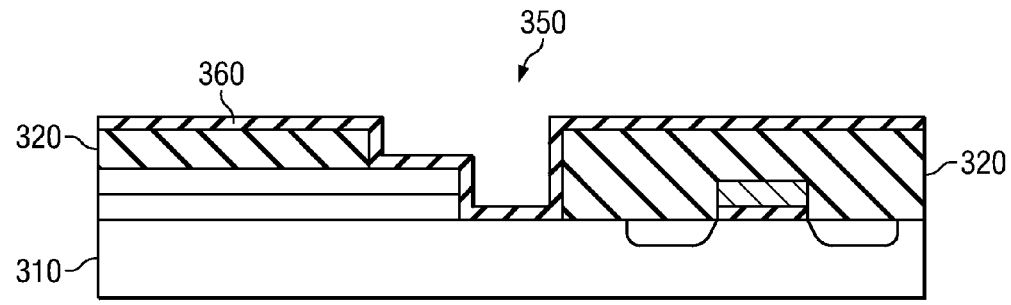
Figure 4F:
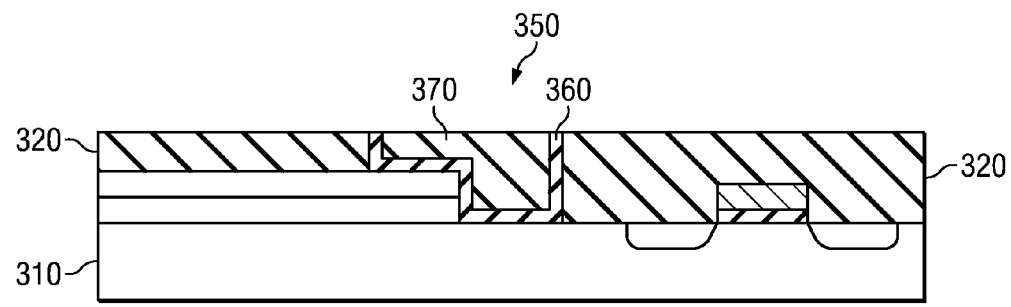

After forming the L-shaped structure 350 in the material layer 320 the photoresist 330 may be removed and the L-shaped structure 350 may be optionally lined with a barrier layer 360. The barrier layer 360 may be titanium nitride (TiNi) or tantalum nitride (TaNi) or similar materials. This is shown in FIG. 4e. Referring now to FIG. 4f, the barrier layer 360 lined L-shaped structure 350 is then filled with a conductive material 370. The conductive material 370 may be tungsten (W), copper (Cu) or a similar material. The workpiece 300 is then planarized so that the conductive material 360 and the barrier layer 370 are removed over the material layer 320. Planarization may be carried out by a chemical mechanical polishing (CMP) process. Further material layers may be formed and processed on the workpiece 300 thereafter.

The formation of the L-shaped structure 350 is described above for a conductive layer embedded in an isolation layer. For example, the L-shaped structure 350 may be embedded in a contact layer, a via layer or a metallization layer. The L-shaped structure 350 may also be formed as an isolation structure in a conductive layer or as a conductive or isolation structure in a substrate. In FIGS. 4a-4f the formation of only one L-shaped structure 350 was described, but in other embodiments there may be a plurality of L-shaped structures 350. The L-shaped structure may be formed by a lithography mask using only one of the embodiments of FIGS. 2a-2c or may be formed by a lithography mask using a combination of the embodiments of FIGS. 2a-2c.

FIGS. 5a-5d illustrate a six transistor SRAM cell and embodiments of an L-shaped structure for the six transistor SRAM cell. Using L-shaped contacts in SRAM cells may provide the advantage that the cell density may be increased while a single exposure capability for the contact layer may be maintained. In one embodiment the SRAM storage nodes (Q and Q cross) may be moved from the first metallization layer to the contact layer. Forming such an L-shaped contact may eliminate the storage node (Q and Q cross) from the first metallization layer and the SRAM cell width can be reduced. In one embodiment forming of the L-shaped contact with a single exposure process may replace a double patterning exposure scheme. Such an approach may also enable a cell height reduction since the height of the L-shape contact can be reduced. In one embodiment the L-shaped structure may comprise a curvy shaped form, an oblong curved pattern, or an crescent where one end is elongated or straightened.

Figure 5A:
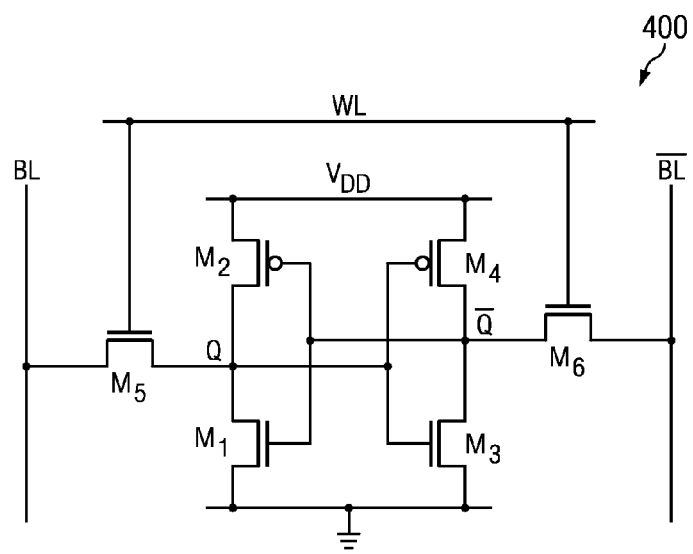
FIG. 5a shows a schematic of a SRAM cell.

FIG. 5a shows a schematic of a six transistor SRAM cell 400. The SRAM cell 400 comprises the transistors M1-M6. M1 and M3 are pull down nFET transistors and M2 and M4 are pFET pull up transistors. M5 and M6 are access nFET transistors. The source of the access transistor M6 is connected to the inverted bit line (BL cross) and the source of the access transistor M5 is connected to the bit line (BL). The gates of the access transistors M5 and M6 are connected to the word line WL. The sources of the pull up transistors M2 and M4 are connected to $V_{dd}$, and the sources of the pull down transistors M1 and M3 are connected to ground $V_{ss}$. The storage nodes are Q and Q cross.

Figure 5B:
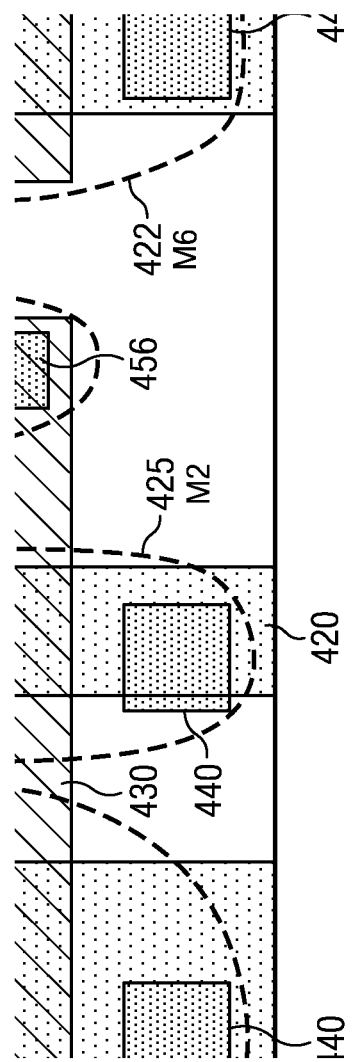
FIG. 5b shows a design layout of the SRAM cell.

FIG. 5b illustrates a design layout 410 of the six transistor SRAM cell 400. As can be seen from FIG. 5b the layout comprises diffusion areas 420 to be embedded in a substrate and polysilicon or metal gate lines 430 to be formed over the substrate. The diffusion areas 420 may form the sources and drains of the transistors M1-M6 and the polysilicon or metal gate lines 430 may form the gates of the transistors M1-M6. Area 421 marks the access transistor M5 and area 422 marks the access transistor M6. Area 423 marks the pull down transistor M1 and area 424 marks the pull down transistor M3. Area 425 marks the pull up transistor M2 and area 426 marks the pull up transistor M4.

FIG. 5b further shows contacts 440 and L-shaped structures 450 to be formed in a contact layer over the substrate. The contacts 440 connect the diffusion areas 420 or the polysilicon or metal gate lines 430 to a metal 1 layer (not shown). The L-shaped features 450 contact diffusion areas 420 and polysilicon or metal gate lines 430 to the metal 1 layer (not shown), for example.

The L-shaped structure 451 connects the drain contact 453 of pull up transistor M2 425 and the drain contact 454 of the pull down transistor M1 423, making the two contacts 453, 454 one contact 451. The L-shaped contact 451 includes also storage node Q. In conventional SRAM cells the two drain contacts 453, 454 of the two transistors 423, 425 are separate and individual contacts which are not connected in the contact layer level but via the metal 1 layer arranged above the contact layer level (not shown). The L-shaped structure 455 connects the drain contact 456 of pull up transistor M4 426 and the drain contact 457 of the pull down transistor M3 424, making the contacts 456, 457 one contact 455. The L-shaped contact 455 includes also storage node Q cross. In conventional SRAM cells the two drain contacts 456, 457 of the two transistors 424, 426 are separate and individual contacts which are not connected in the contact layer level but via the metal 1 layer arranged above the contact layer level (not shown).

Figure 5C:
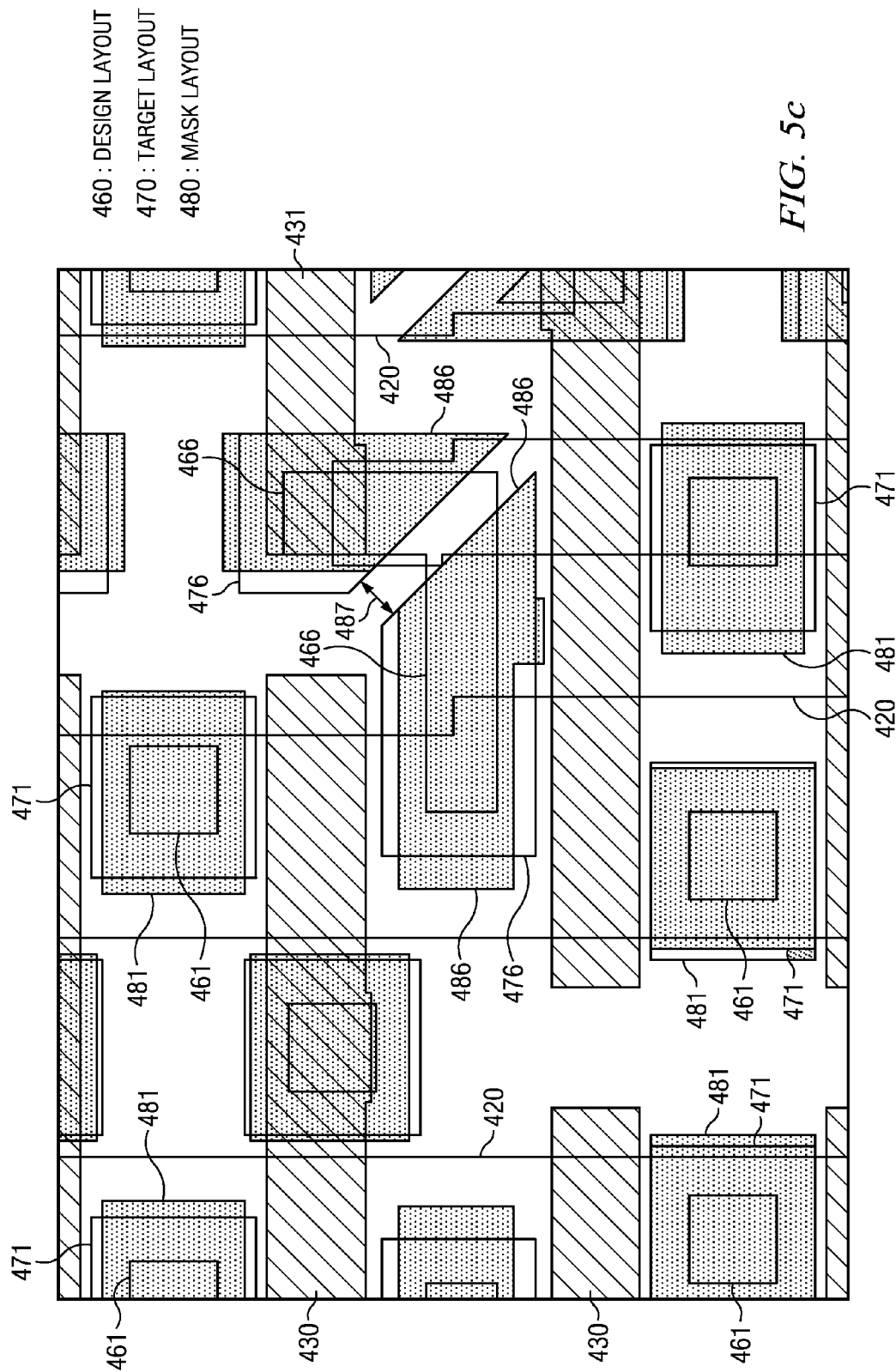
FIG. 5c shows layouts for the SRAM cell and the corresponding lithography mask.

FIG. 5c shows several layouts assembled in one Figure. FIG. 5c shows a portion of FIG. 5b. A design layout 460 for the semiconductor device comprises the diffusion area 420 and the polysilicon or metal gate lines 430. The design layout 460 further comprises the contacts 461 and the L-shaped structure 466. The lithography target layout 470 for the lithography mask 200 comprises the contacts 471 and the L-shaped feature 476. The corresponding mask layout 480 for the lithography mask 200 comprises the contacts 481 and the L-shaped feature 486. The mask layout 480 may be the target layout 470 modified with an OPC process. The mask layout 480 on the lithography mask level may correspond to the design layout 460 for the semiconductor chip. The lithography target layout 470 shows the L-shaped feature 476 of the embodiment of FIG. 1c corresponding to the L-shaped structure 466 of the design layout. The L-shaped structure 466 of the design layout may not comprise a gap. The gap 477 in the lithography target layout is invisible in a print of that feature in the photoresist. The L-shaped structure 466 may be formed by any embodiment for the L-shaped feature 110, 130, 150 shown in FIGS. 2a-2c.

In one example, the gap 477 between the two legs of the L-shaped feature 470 of the lithography target layout 470 may comprise a distance of less than about 50 nm. The non-orthogonal edges of the two sub features of the L-shaped feature 476 are both non orthogonal to all other edges of the L-shaped feature 476. All other edges of the two sub features of the L-shaped feature 476 are orthogonal to each other.

FIG. 5c further shows the L-shaped feature 476 of the target layout 470 arranged between the polysilicon or metal gate lines 430 and overlying the polysilicon or metal line 431.

Figure 5D:
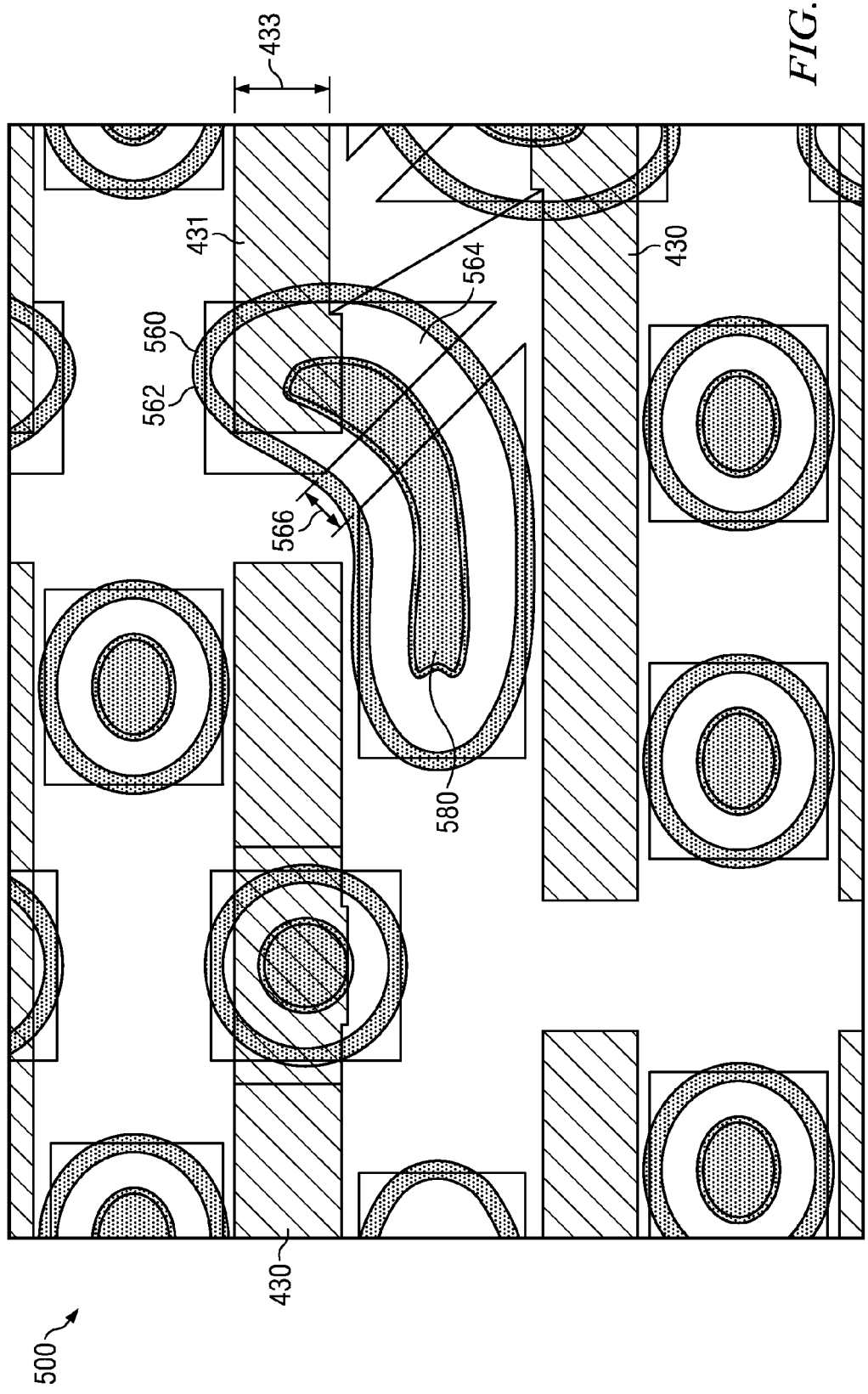
FIG. 5d shows a print image of a photoresist for patterning a material layer.

FIG. 5d shows a print image 500 in the photoresist. The photoresist is shown as transparent so that the underlying structures are visible. An L-shaped structure 560 is printed in the photoresist. The L-shaped structure 560 may comprise the form of a curve, an oblong curved pattern, or an crescent where one end is elongated or straightened. In one embodiment the L-shaped structure 560 overlies the polysilicon or metal gate line 431 and does not overlie the polysilicon or metal lines 430. Exposing a lithography mask 200 having the mask layout 480 including the L-shaped feature 486 may form the L-shaped structure 560. The lithography mask 200 may form an outer shape 562 or an inner shape 564 of the L-shaped structure 560 depending on exposure parameters such as doses, depths of focus and the like. The outer shape 562 marks an upper limit and the inner shape 564 marks a lower limit of the L-shaped structure 560. Any shape between the outer shape 562 and the inner shape 564 may be considered within the tolerances. In one embodiment the L-shaped structure 560 should completely overly the width 433 of the polysilicon or metal gate line 431. In one embodiment the curve 566 of the L-shaped structure 560 may be formed to bypass the polysilicon or metal gate line 471.

In one embodiment the L-shaped structure 580 may be a structure formed in a material layer underlying the photoresist. The L-shaped structure 580 may be a bottom opening and the L-shaped structure 560 may be the top opening of the L-shaped structure formed in the material layer. In such an embodiment the sidewalls are not vertical but tapered.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a semiconductor device, the method comprising:
    forming a photo sensitive layer on a semiconductive substrate; and
    illuminating an L-shaped feature in a reticle thereby forming an L-shaped structure in the photo sensitive layer, wherein the L shaped feature is placed directly over the L-shaped structure, wherein the L-shaped feature comprises a first non-orthogonal edge at an intersection of two legs of the L-shaped feature.

2. The method according to claim 1, wherein illuminating the L-shaped feature comprises a one-time illumination step.

3. The method according to claim 1, wherein the L-shaped feature comprises two sub-structures separated by an opaque lithographic sub-resolution gap.

4. The method according to claim 3, wherein each of the sub-structures comprises a sub feature non-orthogonal edge.

5. The method according to claim 1, wherein the first non-orthogonal edge decreases a width of the L-shaped feature at the intersection.

6. The method according to claim 1, wherein the L-shaped feature comprises a second non-orthogonal edge at the intersection of the two legs.

7. The method according to claim 6, wherein the first non-orthogonal edge and the second non-orthogonal edge are parallel.

8. The method according to claim 6, wherein the first non-orthogonal edge and the second non-orthogonal edge comprise an edge between 40 degree and 50 degree.

9. A lithography mask comprising:
    a transparent substrate; and
    a pattern forming material arranged over the transparent substrate, wherein the pattern forming material comprises a continuous L-shaped feature, wherein the continuous L-shaped feature comprises a first non-orthogonal edge at an intersection of two legs.

10. The lithography mask according to claim 9, wherein the first non-orthogonal edge decreases a width of the continuous L-shaped feature at the intersection.

11. The lithography mask according to claim 9, wherein the continuous L-shaped feature comprises a second non-orthogonal edge.

12. The lithography mask according to claim 9, wherein the first non-orthogonal edge comprises an edge between 40 degree and 50 degree.

13. A method for making a lithography mask, the method comprising:
forming a pattern forming material over a transparent substrate; and
patterning the pattern forming material so that the pattern forming material comprises a continuous L-shaped feature, the continuous L-shaped feature comprising a first non-orthogonal edge at an intersection of two legs.

14. The method according to claim 13, wherein the first non-orthogonal edge decreases a width of the L-shaped feature at the intersection.

15. The method according to claim 13, wherein the continuous L-shaped feature comprises a second non-orthogonal edge.

16. The method according to claim 13, wherein the first non-orthogonal edge is a 45 degree edge.

17. A method for making a semiconductor device, the method comprising:
forming a photo sensitive layer on a semiconductive substrate; and
illuminating a continuous L-shaped feature in a reticle thereby forming an L-shaped structure in the photo sensitive layer, wherein the continuous L-shaped feature comprises a first non-orthogonal edge at an intersection of two legs of the continuous L-shaped feature.

18. The method according to claim 17, wherein illuminating an continuous L-shaped feature comprises a one-time illumination step.

19. The method according to claim 18, wherein the first non-orthogonal edge decreases a width of the continuous L-shaped feature at the intersection.

20. The method according to claim 18, wherein the continuous L-shaped feature comprises a second non-orthogonal edge at the intersection of the two legs.

21. The method according to claim 20, wherein the first non-orthogonal edge and the second non-orthogonal edge are parallel.

22. The method according to claim 20, wherein the first non-orthogonal edge and the second non-orthogonal edge comprise an edge between 40 degree and 50 degree.

* * * * *